United States Patent [19]
Wakamatsu

[11] Patent Number: 5,168,274
[45] Date of Patent: Dec. 1, 1992

[54] POSITION DETECTOR DEVICE
[75] Inventor: Seiichi Wakamatsu, Tokyo, Japan
[73] Assignee: Olympus Optical Co., Ltd., Tokyo, Japan
[21] Appl. No.: 777,682
[22] Filed: Oct. 15, 1991
[30] Foreign Application Priority Data
Oct. 17, 1990 [JP] Japan .................................. 2-276495
Oct. 30, 1990 [JP] Japan .................................. 2-293377
[51] Int. Cl.$^5$ ............................................ H03M 1/22
[52] U.S. Cl. .................... 341/15; 324/207.12; 341/119
[58] Field of Search ............ 341/15, 16, 3, 118, 341/119; 324/207.12, 207.13, 207.24, 207.25, 260

[56] References Cited
U.S. PATENT DOCUMENTS
4,008,432 2/1977 Sugisaki et al. ............... 324/207.12
4,305,072 12/1981 Makita ................................ 341/15

Primary Examiner—A. D. Pellinen
Assistant Examiner—B. K. Young
Attorney, Agent, or Firm—Frishauf, Holtz, Goodman & Woodward

[57] ABSTRACT

A position detector device for detecting the position of a moving object includes a magnetically-recorded section on a moving surface of the moving object where multipoles are magnetized with a wave-length of $\lambda$, and a magnetic sensor for detecting changes in magnetic field by moving of the magnetically-recorded section. The magnetic sensor is provided with $2^N$ ($N=1, 2, 3, \ldots$) pieces of signal detecting magnetic resistance elements connected to constant-current power sources and arranged at an interval of $\lambda/2^{(N+2)}$. The extent to which the moving object is moved is detected on the basis of electric signals outputted from these signal detecting magnetic resistance elements.

17 Claims, 11 Drawing Sheets

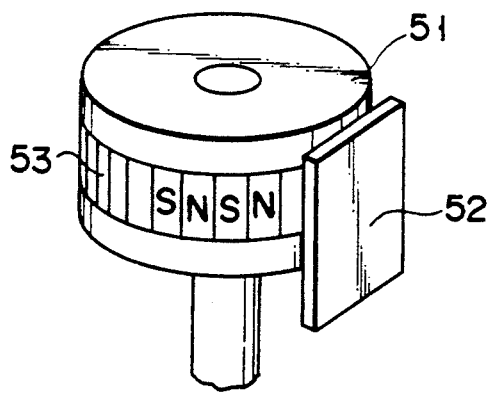
PRIOR ART
FIG. 1
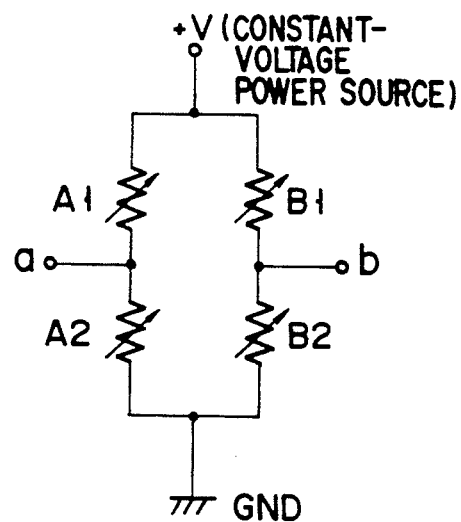
PRIOR ART
FIG. 2
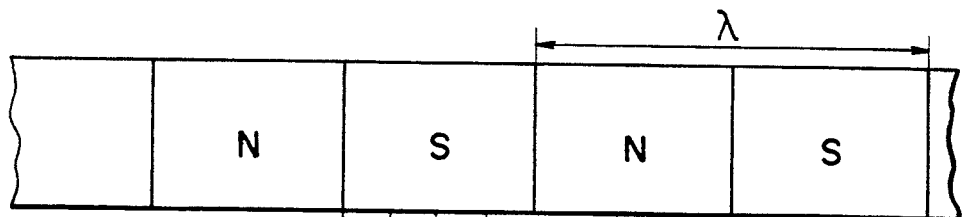
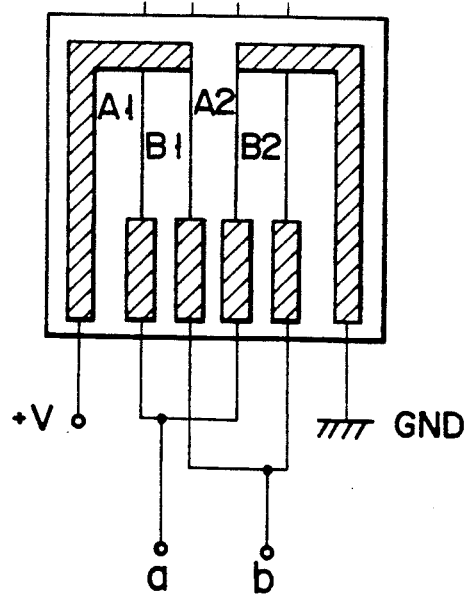
PRIOR ART
FIG. 3

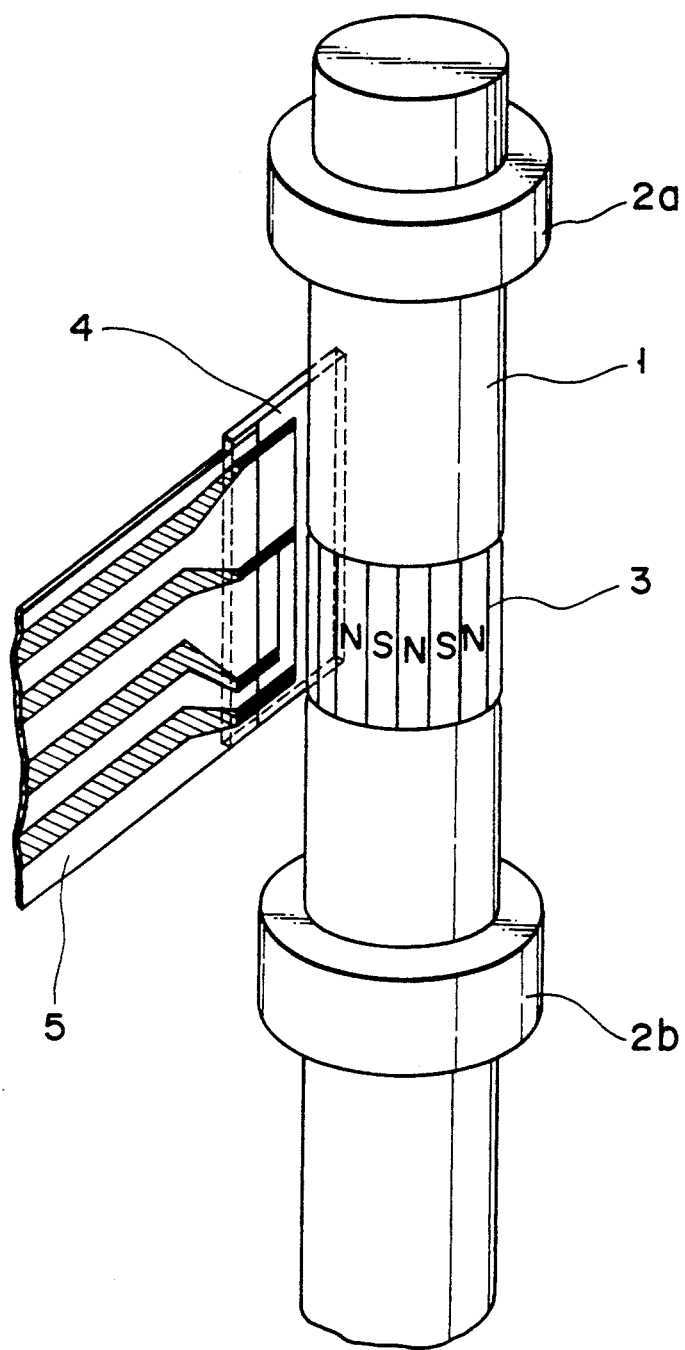
F I G. 4

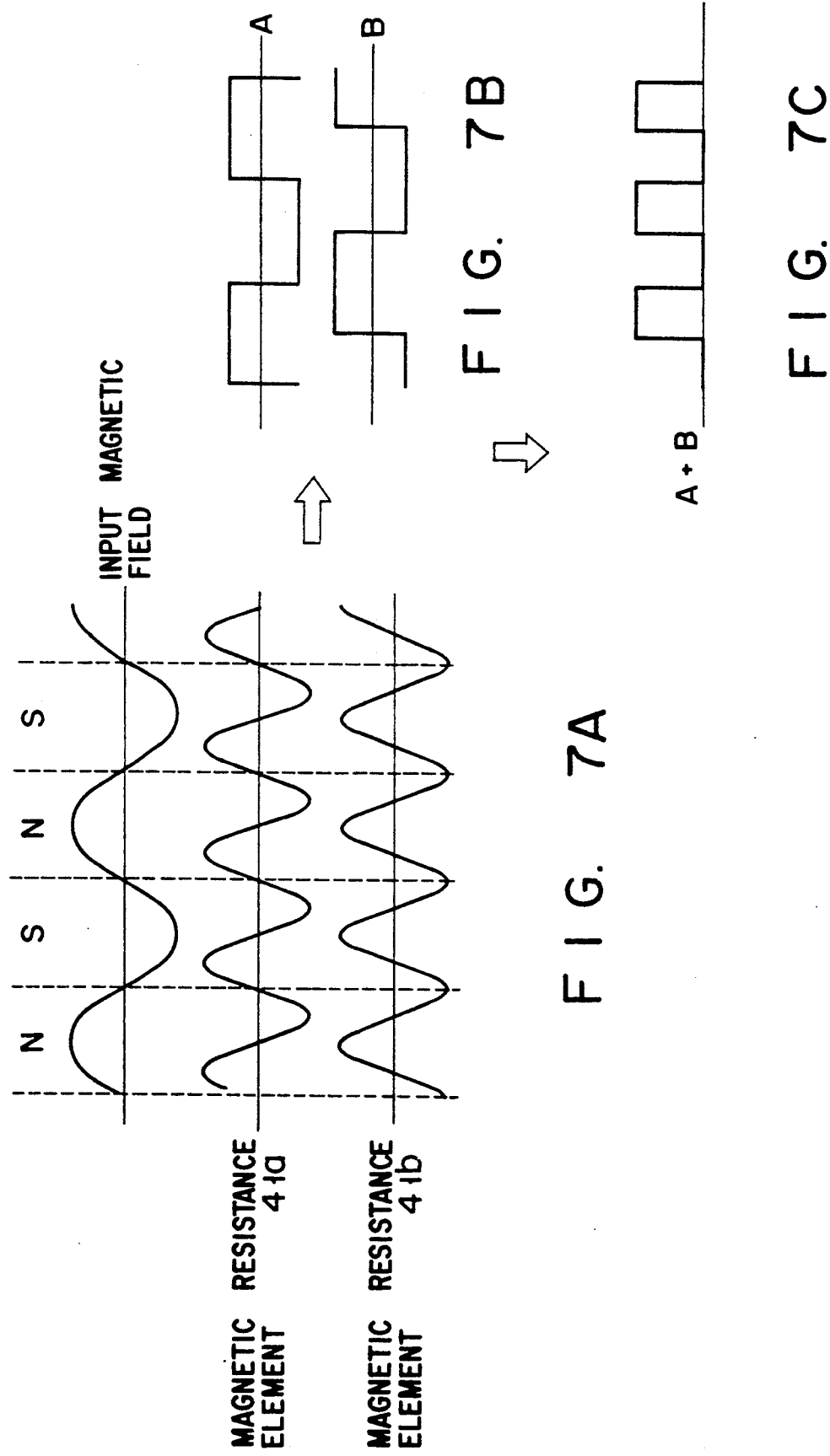

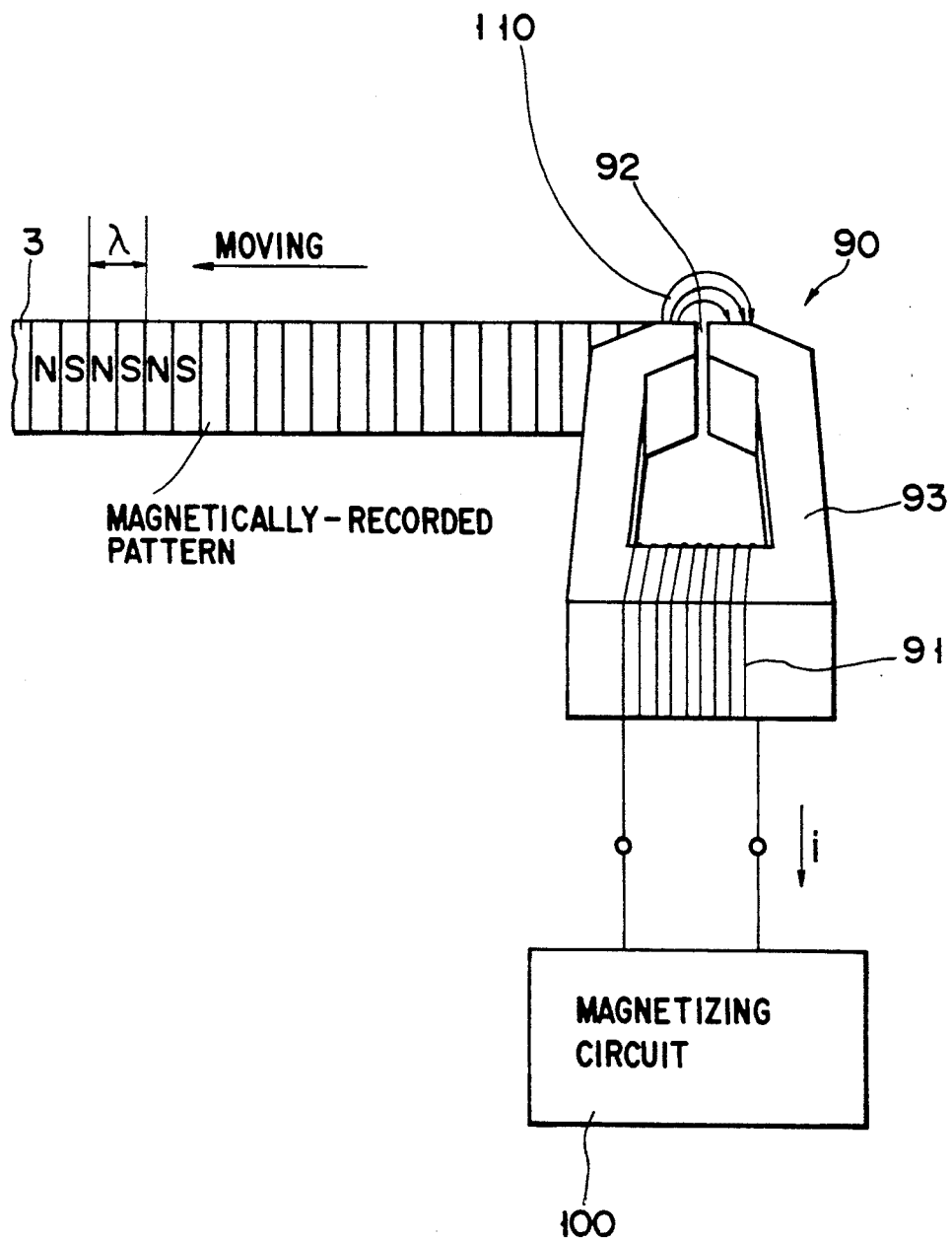
F I G. 9

F I G. 12A 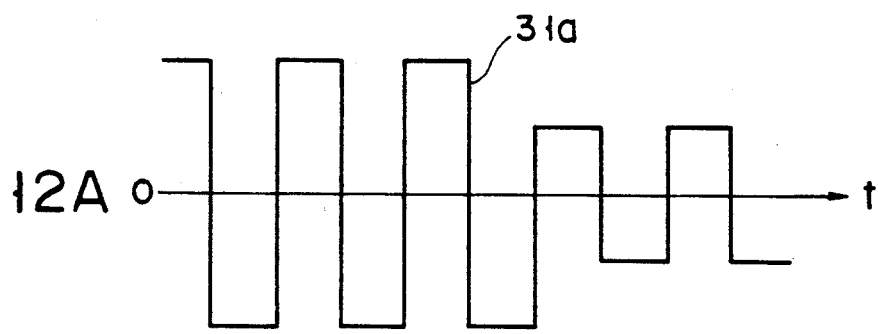
F I G. 12B 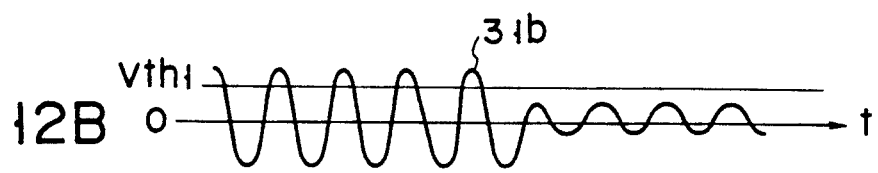
F I G. 12C 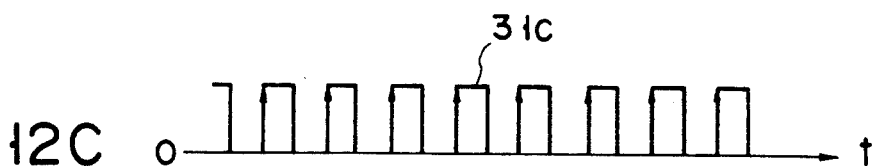
F I G. 12D 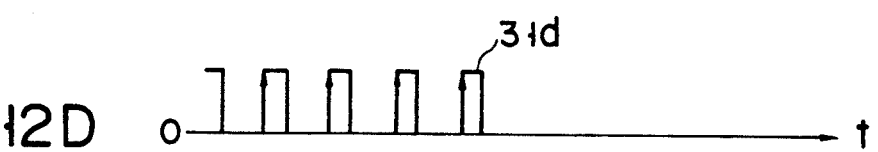
F I G. 12E 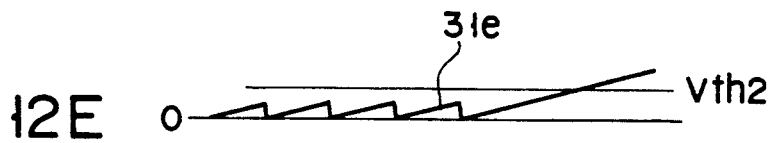
F I G. 12F 

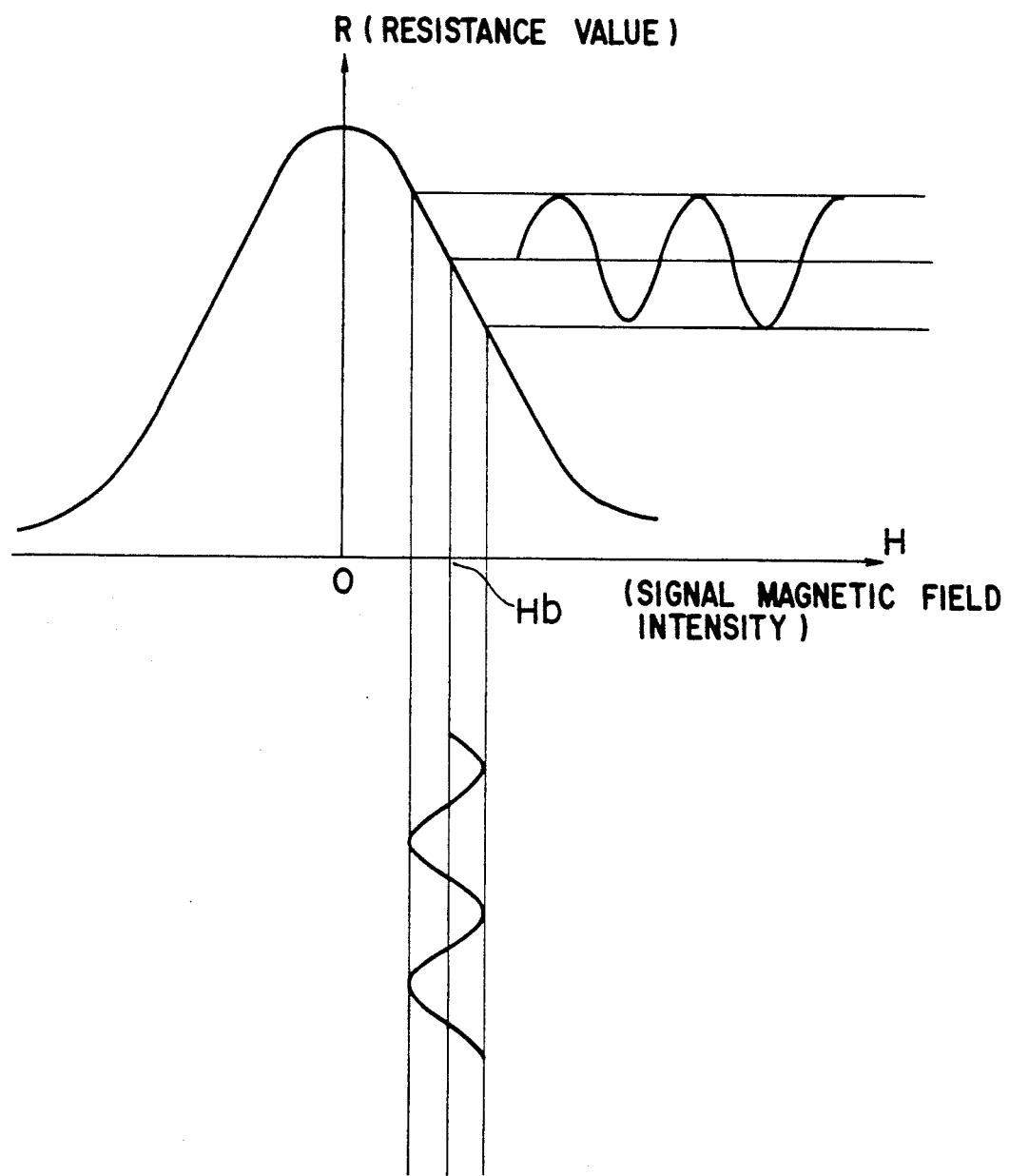
F I G. 14

POSITION DETECTOR DEVICE

BACKGROUND OF THE INVENTION

1. Field of the Invention

The present invention relates to a position detector device for detecting the moving extent, speed and the like of a moving or rotating matter, for example.

2. Description of the Related Art

The conventional position detector device for moving matters will be described with reference to FIGS. 1 through 3.

As shown in FIG. 1, the conventional position detector for moving matters (or rotating matters in this case) includes a magnetic drum 51 provided with a magnetically-recorded section 53 on its side, and a magnetic sensor 52 located to face the magnetic drum 51 and serving to convert changes in magnetic field into electric signals while using magnetic resistance effect. Since the magnetically-recorded section 53 on the side of the magnetic drum 51 is magnetized with a wavelength of λ, the intensity and direction of magnetic field entering into the magnetic sensor 52 change as the magnetic drum 51 is rotated. The rotation angle and speed of the magnetic drum 51 can be detected by detecting these changes of magnetic field by means of the magnetic sensor 52.

The magnetic sensor 52 used by this position detector device has such an arrangement as shown in FIG. 2, for example. Magnetic resistance elements A1 and A2 connected in series to each other are connected parallel to magnetic resistance elements B1 and B2 which are also connected in series to each other. Voltage of V is applied from a constant-voltage power source to these magnetic resistance elements. Terminals a and b are connected between the magnetic resistance elements A1 and A2 and between the magnetic resistance elements B1 and B2, respectively, and these four magnetic resistance elements A1, A2, B1 and B2 are arranged at an interval of λ/8, as shown in FIG. 3.

When voltage changes between the terminal a and the ground and between the terminal b and the ground are detected while applying voltage of V to between the series-connected magnetic resistance elements and between the other series-connected magnetic resistance elements and keeping the magnetic drum rotating, two-phase signal outputs can be obtained. The two-phase signals thus obtained are false sine waveforms shifted in phase only by a period of ¼. When these output voltages are converted into pulse waveforms, while detecting the zero cross point of them, and the exclusive "or" of these pulse waveforms is picked up, two pulses can be obtained every time the magnetized pattern on the side of the magnetic drum is rotated one pitch. The rotation angle and speed of the magnetic drum are detected on the basis of this pulse number.

For the purpose of obtaining $2^N$ (N=1, 2, 3 ...) pulses every time the magnetized pattern is rotated one pitch in the case of this conventional position detector device, it is needed that $2^{(N+1)}$ pieces of magnetic resistance elements are arranged at an interval of $\lambda/2^{(N+2)}$. On the other hand, the size of the magnetic sensor becomes larger and the number of terminals needed to connect the magnetic sensor to external circuits also becomes larger as the number of magnetic resistance elements is increased more and more.

The magnetic sensor is usually made according to the vapor-depositing, sputtering or photolithographic process. Its cost can be therefore made lower as the number of magnetic sensors which can be obtained from a wafer becomes larger. As the number of magnetic resistance elements needed becomes larger and the size of the magnetic sensor becomes larger, too, therefore, the cost of the magnetic sensor is naturally made higher. Further, when the number of terminals for the magnetic sensor is thus increased, the number of connecting steps is made larger because of connecting points increased, thereby causing the cost of connecting cables to be added.

It has been strongly desired these days to provide a position detector device, extremely smaller in size and higher in resolution. In the case of the above-described conventional position detector device, however, the size of its magnetic sensor is too large and signals detected by its magnetic sensor are drifted by temperature change.

On the other hand, the diameter of the magnetic drum on the side of which the magnetized pattern is formed can be made smaller to make the position detector device smaller in size, but distances (which will be hereinafter referred to as gap lengths) between the outer circumference of the magnetic drum and some of the magnetic resistance elements of the magnetic sensor become longer. As the result, magnetic intensity applied from the magnetically-recorded section to the magnetic resistance elements cannot be kept certain and output signal waveforms are thus distorted.

Japanese Patent Disclosure Sho 60-196619 discloses a position detector device for measuring the speed of a rotating matter and the passage of a reference position thereof. This position detector device includes a magnetic drum attached to a motor shaft and provided with a magnetically-recorded section on the outer circumference thereof, and a magnetic sensor for converting changes in magnetic field into electric signals while using magnetic resistance effect. The magnetically-recorded section comprises a first and a second encoder tracks. On the first encoder track, a continuous magnetized pattern is recorded. On the second encoder track, plural magnetized patterns are recorded at an interval to create plural reference signals every time the magnetic drum is once rotated. On the other hand, the magnetic sensor includes a magnetic resistance element for detecting magnetic signals from the first encoder track and another magnetic resistance element for detecting reference signal from the second track.

In the case of this position detector device, however, encoder and reference signals must be recorded on the two magnetically-recorded tracks independently of the other and the magnetic sensor must include the magnetic resistance elements one for detecting magnetic signals from the encoder track and the other for detecting those from the reference signal track, so as to obtain encoder and reference signals. The position detector device is therefore unsuitable for being made smaller in size and its material cost is also increased.

SUMMARY OF THE INVENTION

An object of the present invention is therefore to provide a position detector device which can be made smaller in size, lower in cost and higher in resolution by improving the magnetic sensor used by the position detector device. More specifically, the position detector device is arranged so that the number of magnetic resistance elements needed is reduced to make the magnetic sensor smaller in size and lower in cost and that the magnetic sensor is kept unaffected by temperature change.

Another object of the present invention is to provide a position detector device which can be made smaller in size and lower in cost by improving the magnetically-recorded section on the moving matter used by the position detector device. More specifically, the position detector device is arranged so that encoder and reference signals can be obtained from a single magnetically-recorded track.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows the conventional position detector device comprising a moving matter and a magnetic sensor for detecting the moving matter;

FIG. 2 shows the arrangement of a circuit formed on the magnetic sensor shown in FIG. 1;

FIG. 3 shows the relation between a magnetically-recorded track on the moving matter and the magnetic sensor shown in FIG. 1;

FIG. 4 is a perspective view showing a position detector device according to the present invention;

FIG. 7A shows the relation between input magnetic field and each of magnetic resistance elements shown in FIG. 5;

FIG. 7B shows pulse waveforms converted from output voltages shown in FIG. 7A;

FIG. 7C shows the exclusive "or" of the pulse waveforms shown in FIG. 7B;

FIG. 9 shows a head for magnetizing the moving matter in FIG. 4 along a single track;

FIGS. 12A through 12F show waveforms from which increment and reference signals can be continuously obtained by the position detector device of the present invention;

FIG. 14 shows DC bias magnetic field added to magnetic resistance elements of the magnetic sensor in the cases shown in FIGS. 13A through 13E.

DETAILED DESCRIPTION OF THE PREFERRED EMBODIMENTS

Figure 5:
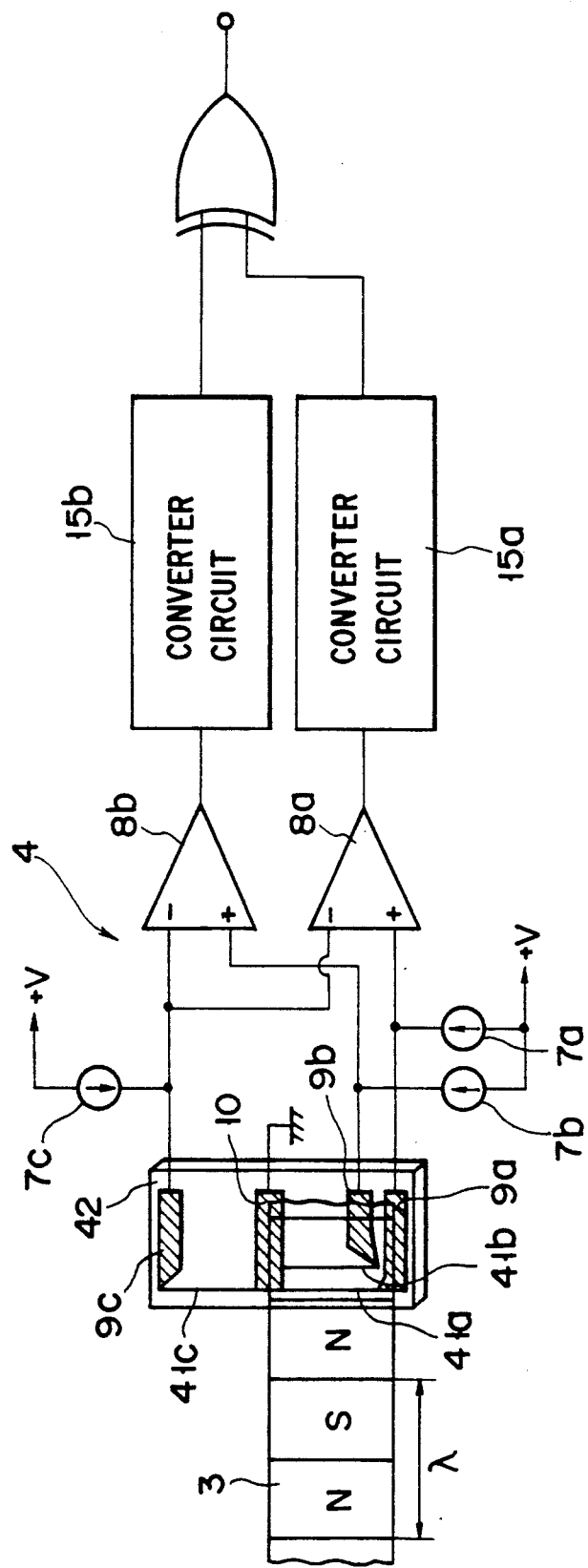
FIG. 5 is a plan showing the arrangement of a magnetic sensor shown in FIG. 4.

Some embodiments of the present invention will be described in detail with reference to the accompanying drawings.

FIG. 4 shows the whole arrangement of a position detector device according to the present invention which is used relative to a rotating matter. A cylindrical rotating shaft 1 is held freely rotatable by a pair of roller bearings 2a and 2b. A magnetically-recorded section 3 where an S pole and a N pole are magnetized alternately in a direction in which the rotating shaft 1 is rotated is formed on that outer circumference of the rotating shaft 1 which is positioned between the bearings 2a and 2b. A magnetic sensor 4 for converting periodic changes of magnetic field caused as the rotating shaft 1 is rotated into electrical signals is located relative to the magnetically-recorded section 3 on the rotating shaft 1 with a predetermined interval interposed between them. Output signals of this magnetic sensor 4 are connected to an electric circuit outside through a flexible base plate 5.

The magnetic sensor 4 which is needed to provide position detector device, smaller in size, lower in cost and higher in resolution, will be described in detail.

As shown in FIG. 5, the magnetic sensor 4 comprises ferromagnetic-material-made magnetic resistance elements 41a–41c (which will be hereinafter referred to as magnetic resistance elements) and terminals 9a–9c vapor-deposited on a glass base plate 42. In the case of this embodiment, the two magnetic resistance elements 41a and 41b which serve to detect changes of magnetic field caused as the rotating shaft 1 is rotated are formed on that portion of the glass base plate 42. The base plate 42 faces the magnetically-recorded section 3 on the rotating shaft 1 in such way that these two elements are perpendicular to the rotating direction of the shaft 1 and that they are parallel to each other in the circumferential direction of the shaft 1. The two elements 41a and 41b are shifted from each other by $\lambda/8$, when the magnetizing pitch is $\lambda$.

Further, the compensating magnetic resistance element 41c is formed on the other portion of the glass base plate 42 which is left unaffected by magnetic field caused by the magnetized section on the rotating shaft 1, so that drift of the electrically-converted signals from the elements 41a and 41b caused by temperature change is compensated.

The magnetic resistance elements 41a–41c are connected at their one ends to constant-current power sources 7a–7c through the terminals 9a–9c. The other ends of these elements 41a–41c are grounded through a common terminal 10. The terminals 9a and 9b are connected to not-inverted input terminals of differential amplifiers 8a and 8b and the terminal 9c is connected to inverted input terminals thereof. As the result, differential signal between the magnetic resistance elements 41a and 41c is outputted from the differential amplifier 8a and differential signal between the magnetic resistance elements 41b and 41c is outputted from the differential amplifier 8b.

Figure 6:
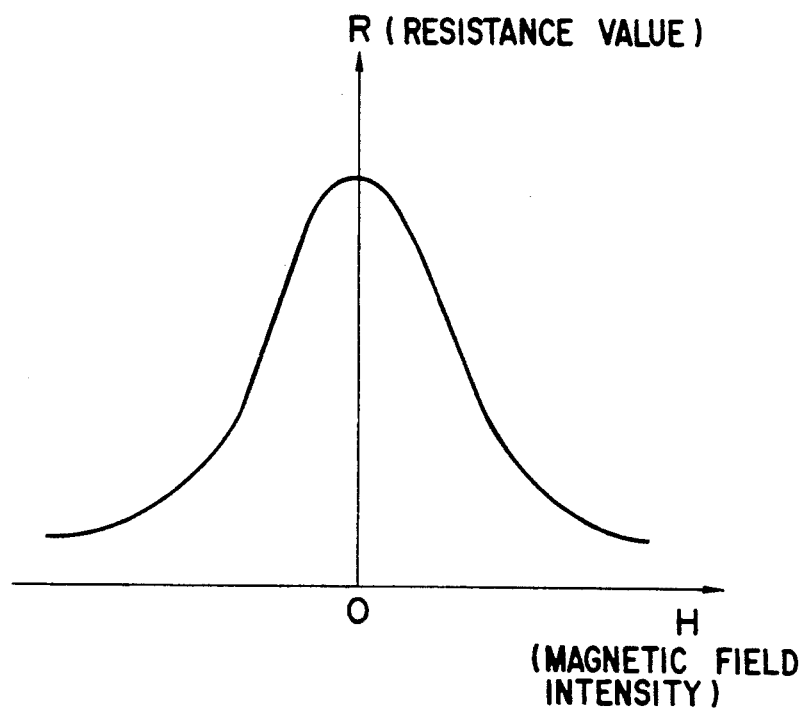
FIG. 6 is a graph showing the relation between magnetic field intensity and magnetic resistance.

When the rotating shaft 1 is rotated in the above-described arrangement, magnetic field passing through the magnetic resistance elements 41a and 41b changes responsive to the magnetized pattern on the magnetically-recorded section 3 of the rotating shaft 1. As the result, electric resistance values of the magnetic resistance elements 41a and 41b change following the relation between magnetic field and resistance changing rate in FIG. 6. As shown in FIG. 5, constant-currents are supplied from the constant-current power sources 7a and 7b to the magnetic resistance elements 41a and 41c. Therefore, output signals of the magnetic resistance elements 41a and 41b are represented by false sine waves which depend upon the above-mentioned changes in magnetic field.

FIG. 7A shows the relation of each of the magnetic resistance elements 41a and 41b relative to input magnetic field. Because non-bias drive is used by the present invention, output of two wavelengths, though the magnetic field inputted has one wavelength, can be obtained through each of the magnetic resistance elements 41a and 41b. When this is used, the resolution of the magnetic sensor can be doubled. Both false sine waves of the magnetic resistance elements 41a and 41b are shifted in phase from each other by ¼ period because they are located, shifting from each other by ⅛ of the magnetizing pitch, as described above.

As shown in FIG. 5, output signals are applied from the differential amplifiers 8a and 8b to converter circuits 15a and 15b where they are converted to pulse waveforms while detecting the zero cross point of output voltages (see FIG. 7B). When the exclusive "or" of these pulse waveforms is picked up, two pulses can be obtained every time the magnetized pattern is rotated one pitch (see FIG. 7C). The rotation angle of the rotating shaft 1 can be detected when this pulse number is detected.

As described above, the magnetic resistance element 41c is formed on that portion of the glass base plate 42 which is left unaffected by changes in magnetic field caused by the magnetized pattern on the rotating shaft 1. In addition, this magnetic resistance element 41c allows its resistance change caused by change in ambient temperature. This resistance change caused by ambient temperature change is similarly seen in each of the magnetic resistance elements 41a and 41b. When output voltage differences between the magnetic resistance elements 41c and 41a and between the magnetic resistance elements 41c and 41b are picked up by the differential amplifiers 8a and 8b, changes in magnetic field caused by the magnetically-recorded section 3 on the rotating shaft 1 can be detected as voltage change without being affected by ambient temperature change.

Because the magnetic resistance element for compensating those resistance changes of the other magnetic resistance elements which are caused by ambient temperature change is added as described above, detection error caused by ambient temperature change can be made extremely smaller.

In the case of the magnetic sensor as described above, $2^N$ pieces of magnetic resistance elements which are driven by constant current are arranged at an interval of $\lambda/2^{(N+2)}$, so that a pulse number of $2^N$ (N=1, 2, 3 ...) can be obtained every time the magnetized pattern on the magnetically-recorded section is rotated one pitch. Therefore, the number of magnetic resistance elements needed to obtain a pulse number of $2^N$ in this case can be reduced to $2^{(N+1)}-2^N=2^N$, as compared with the conventional case of constant-voltage drive. The number of magnetic resistance elements needed can be reduced by four to obtain 4 pulses and by sixteen to obtain 16 pulses, for example. Further, it is assumed that voltage drop of each of the signal detecting magnetic resistance elements whose number is $2^N$ be represented by $V_s$ (S=1, 2, 3 ... $2^N$) and that voltage drop of the temperature compensating magnetic resistance element be denoted by $V_r$, rotation detecting signal of $2^N$ phase can be correctly obtained from $V_s - V_r$.

Although the case of N=1 has been described in the above arrangement, same thing can be said about a case where the value of N is increased like 2, 3, 4 ....

Figure 8:
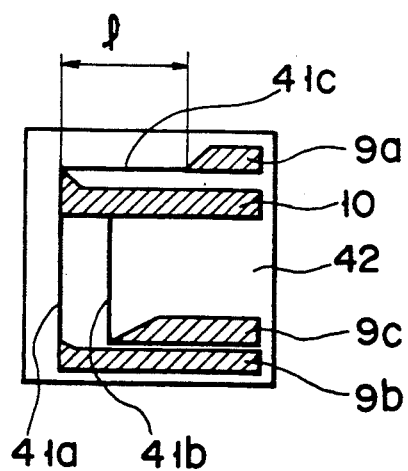
FIG. 8 shows a variation of the magnetic sensor.

FIG. 8 shows a second variation of the magnetic sensor 4 which is used by the position detector device of the present invention. Description will be omitted on same components as those shown in FIG. 5. The compensating magnetic resistance element 41c is located just above and substantially perpendicular to the signal detecting magnetic resistance elements 41a and 41b, and its length $\lambda$ is set substantially larger than $\lambda/2$ when the wavelength recorded is $\lambda$. When the magnetic resistance elements are arranged in this manner, the magnetic sensor 4 can be smaller-sized. Further, when the length l of the resistance element is made larger than $\lambda/2$, influence added by magnetic field leaked from the magnetically-recorded section 3 can be reduced.

According to the above-described magnetic sensor which is used by the position detector device of the present invention and made smaller as compared with the conventional ones, because the number of magnetic resistance elements and terminals for external connection can be reduced. As a result, the magnetic sensor can be smaller-sized and made lower cost. Further, the interval (or gap length) of each of the magnetic resistance elements relative to the magnetic drum can be made substantially same because the number of magnetic resistance elements is reduced. As the result, the peak value of magnetic field intensity added from the magnetic drum to each of the magnetic resistance elements can be made substantially same. Therefore, the signal value outputted from each of the magnetic resistance elements and the size of its waveform distortion can be kept substantially same.

Figure 10:
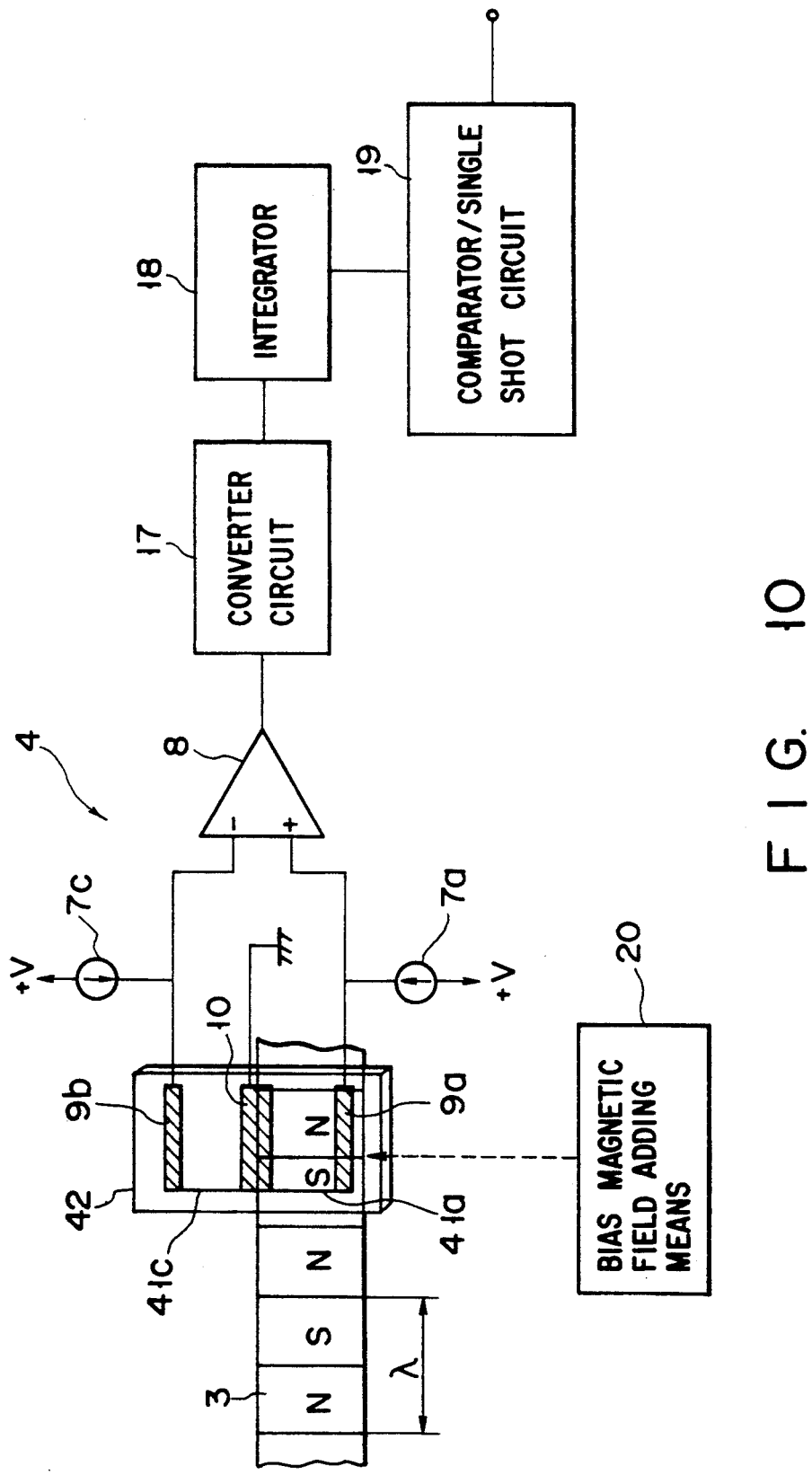
FIG. 10 shows a magnetic sensor for detecting the moving matter magnetized by the magnetizing head shown in FIG. 9.

An improvement of the magnetically-recorded track which is needed to provide a position detector device, smaller in size and lower in cost will be described in detail. As shown in FIG. 10, the magnetic sensor 4 comprises the magnetic resistance elements 41a and 41c and the terminals 9a-9c vapor-deposited on the glass base plate 42. The magnetic resistance elements 41a and 41c are connected at their one ends to the constant-current power sources 7a and 7c through the terminals 9a and 9b. The other ends of these magnetic resistance elements 41a and 41c are grounded through the common terminal 10. The terminal 9b is connected to the inverted terminal of a differential amplifier 8 while the terminal 9a to the not inverted terminal thereof. As the result, differential signal between the magnetic resistance elements 41a and 41c can be detected from the differential amplifier 8.

The magnetic resistance element 41a serves to detect magnetic signal from the magnetically-recorded section 3 on the rotating shaft 1 and it is located perpendicular to a direction in which the rotating shaft 1 is rotated. The magnetic resistance element 41c serves as a reinforcing one for preventing the electrically-converted signal of the magnetic resistance element 41a from being drifted by temperature change, and it is formed on that portion of the glass base plate 42 which is left unaffected by magnetic field from the magnetically-recorded section 3 on the rotating shaft 1.

FIG. 9 schematically shows a manner by which the section 3 is magnetized. A magnetizing head 90 has a yoke 93 provided with a magnetizing gap 92, and a winding 91 wound round the yoke 93. Magnetizing current i is supplied to the winding 91 by a magnetizing circuit 100. Magnetic flux generated by magnetizing current i is passed through the yoke 93 and leaked as leaked magnetic field outside the yoke 93 through the magnetizing gap 92. The magnetizing head 90 and the magnetically-recorded section 3 on the rotating shaft 1 are located adjacent to and closely contacted with each other. When the polarity and intensity of magnetizing current i are changed while moving the magnetically-recorded section 3 on the rotating shaft 1 relative to the magnetizing head 90, therefore, a magnetically-recorded pattern having a recorded wavelength λ can be obtained.

Figure 11:
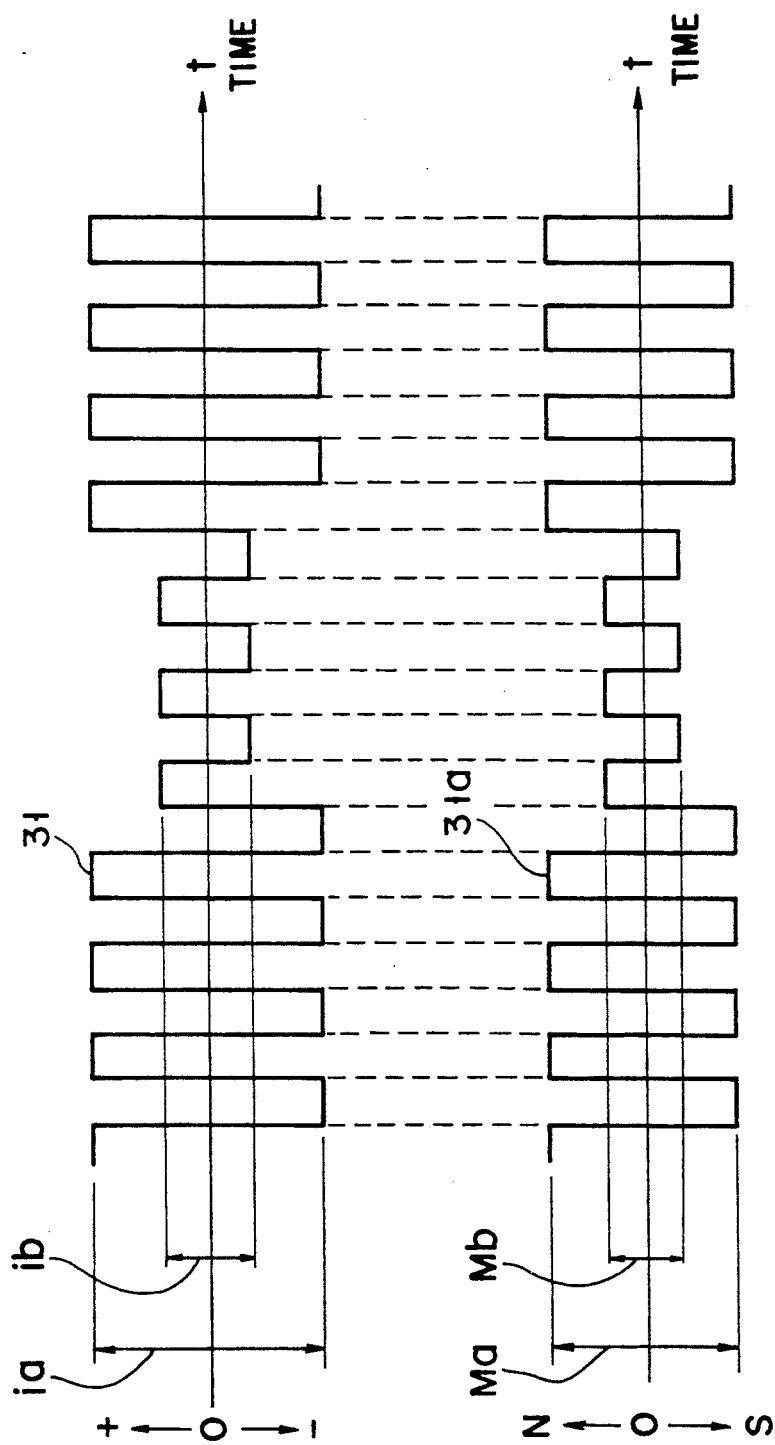
FIG. 11 shows the relation between magnetizing current used to magnetize the moving matter by the magnetizing head in FIG. 9 and a magnetized pattern.

FIG. 11 shows the relation between the magneting current i and the magnetized pattern. When magnetizing currents ia and ib are set appropriate values, a magnetized pattern 31a having magnetized intensities (or magnitudes of magnetization) of Ma and Mb can be obtained at the section 3, depending upon the magnetizing currents applied (the practically-magnetized pattern 31a has a waveform or false sine waveform made rough in shape by the influence of converting-magnetic field, but it is schematically shown as a rectangular waveform sharp in shape in FIG. 11).

When the rotating shaft on which the magnetized pattern has been formed is rotated in the above case, magnetic field passing through the magnetic resistance element 41a shown in FIG. 10 changes responsive to the magnetized pattern 31a at the section 3 on the rotating shaft 1. As the result, the electric resistance value of the magnetic resistance element 41a changes following the relation between magnetic field and resistance changing rate shown in FIG. 6. Constant current is supplied from the constant-current power source 7a to the magnetic resistance element 41a, as shown in FIG. 10. Therefore, a voltage waveform 31b shown in FIG. 12B is outputted from the magnetic resistance element 41a in response to changes in magnetic field caused by the magnetized pattern 31a shown in FIG. 12A.

When this output signal is applied to a converter circuit 17 and converted there into a pulse waveform while detecting the zero cross point of this output voltage, an increment signal 31c shown in FIG. 12C can be obtained. When the output signal is converted into a pulse waveform, using a threshold value voltage a $V_{th1}$ shown in FIG. 12B this time, a pulse waveform 31d shown in FIG. 12D can be obtained. When this pulse waveform 31d is passed through an integrator 18 which has an appropriate time constant, a saw-tooth waveform 31e can be obtained. When this saw-tooth waveform 31e is further passed through a comparator and single shot circuit 19 which has a threshold value voltage $V_{th2}$, a waveform 31f shown in FIG. 12F can be obtained.

The following encoder signals can be thus obtained.

1) Continuous increment signal can be obtained using the waveform 31c, and 2) reference (or origin) signal can be obtained using the waveform 31f.

According to the above-described position detector device, continuous increment and reference signals can be obtained using one piece of the magnetic resistance element, while partially changing the magnetizing intensity at the section 3 which comprises a single magnetically-recorded track. As the result, it becomes easier to make the magnetic drum and sensor smaller-sized.

Further, the above-described magnetic resistance element 41c is left unaffected by changes in magnetic field caused by the magnetized pattern at the section 3 on the rotating shaft 1, but it allows change in its resistance caused by change in ambient temperature to be detected. This resistance change caused by ambient temperature change is similarly included in the magnetic resistance element 41a. When output voltage difference between the magnetic resistance elements 41c and 41a is picked up by the differential amplifier 8, therefore, change in magnetic field caused by the magnetically-recorded section 3 can be detected as voltage change without being affected by ambient temperature change. As the result, rotation angle detecting error caused by ambient temperature change can be made extremely smaller.

Figure 13A:
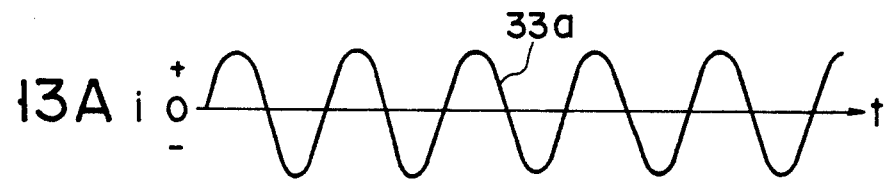
FIGS. 13A through 13E show other waveforms from which increment and reference signals can be continuously obtained by the position detector device of the present invention.
Figure 13B:
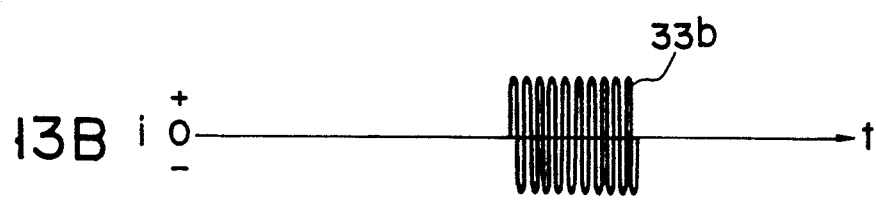
Figure 13C:
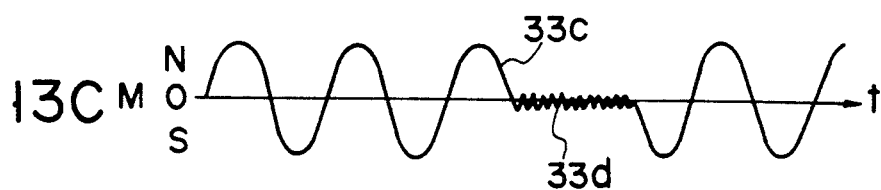
Figure 13D:
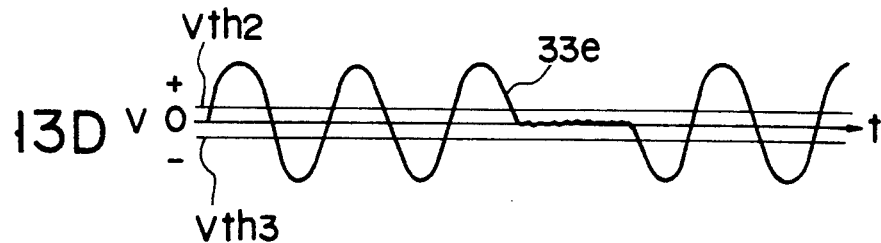

FIGS. 13A through 13E shows a case where the magnetized pattern is changed by the magnetizing head 90 shown in FIG. 9. Current having a waveform 33a shown in FIG. 13A is supplied to the magnetizing head 90 in this case to magnetize the section 3. Current having a waveform 33b which is shown in FIG. 13B and whose frequency is for example 100 times that of the waveform 33a is supplied to the magnetizing head 90 to alternating-current-erase that portion of the section 3 where the waveform 33a has been magnetized. As the result, the magnetized intensity (or strength of remaining magnetic field) M at the magnetically-recorded section 3 is as shown in FIG. 13C. That portion of the section 3 where a waveform 33d is to be magnetized has been alternating-current-erased. Namely, a waveform 33c comprises a remaining component of the waveform 33a which is not erased by the waveform 33b, and a recorded component of the waveform 33b.

When the wavelength of that portion of the section 3 which is magnetized by the waveform 33b is represented by λac and the stripe width of the signal detecting magnetic resistance element by D, an alternating-current-erasing frequency is set to be λac=D/N (N=1, 2, 3 ...) and λac<λ/3. Namely, DC bias magnetic field is added to the magnetic resistance element by a bias magnetic field adding means 20 (see FIG. 10). When DC bias magnetic field is added in this manner, the operating point is shifted to an area where the change of resistance value of the magnetic resistance element is linearly relative to signal magnetic field intensities, as shown by a characteristic graph in FIG. 14. Output voltage applied from the magnetic sensor which is provided with this magnetic resistance element comes to have a waveform 33e shown in FIG. 13D and left unaffected by the recorded component of the waveform 33b.

Figure 13E:
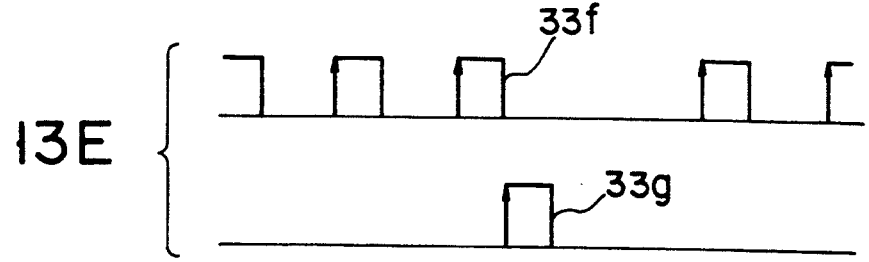

When this waveform 33e is processed by the same manner as described above, increment signal having a waveform 33f shown in FIG. 13E and reference signal having a waveform 33g also shown in FIG. 13E can be obtained. The duty rate of the waveform 33f is shifted from 50% because it is passed through the comparator circuit which has the threshold value voltage $V_{th2}$. When a comparator circuit of the window type whose voltage has two threshold values of $V_{th2}$ and $V_{th3}$ is used, this duty rate can be made nearer 50%.

As described above, the magnetically-recorded section in the case of the position detector device according to the present invention is a single track having areas where magnetized intensities are different and where continuous and reference signals can be detected by the magnetic sensor. The position detector device according to the present invention can be therefore smaller-sized and its cost can be made lower, as compared with the conventional ones in which the magnetically recorded section has plural tracks from which these signals are detected respectively.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A position detector device comprising:
a moving object;
a magnetically-recorded section on the surface of the moving object, having multipoles magnetized with a wavelength of λ; and
a magnetic sensor located to face said magnetically-recorded section to detect changes in magnetic field caused by the movement of the moving object, said magnetic sensor including $2^N$ (N=1, 2, 3...) pieces of signal detecting magnetic resistance elements arranged at an interval of $\lambda/2^{(N+2)}$ to convert the changes in magnetic field into electric signals respectively, a compensating magnetic resistance element for adding a compensating electric signal to each of the electrically-converted signals to compensate drift of said electrically-converted signal caused by temperature change, drive means for driving these elements by constant-current, and detector means for detecting the extent to which said moving object is moved on the basis of said electric signals and said compensating electric signal.

2. The position detector device according to claim 1, which includes a common base plate on which said $2^N$ pieces of signal detecting magnetic resistance elements and said compensating magnetic resistance element are arranged.

3. The position detector device according to claim 2, wherein said $2^N$ pieces of signal detecting magnetic resistance elements are arranged perpendicular to a direction in which the moving object is moved and extend parallel to each other.

4. The position detector device according to claim 3, wherein said compensating magnetic resistance element is arranged at a position where only its resistance change caused by temperature change is detected.

5. The position detector device according to claim 3, wherein said compensating magnetic resistance element is arranged substantially perpendicular to the signal detecting magnetic resistance elements and has a length of at least 80 /2.

6. The position detector device according to claim 1, wherein said detector means includes converter circuits for pulse-converting output signals applied from the signal detecting magnetic resistance elements to pulses of a predetermined number relative to a magnetized pitch at the magnetically-recorded section on the moving object.

7. The position detector device according to claim 1, wherein said detector means includes differential amplifiers for outputting differential signals between the electrically-converted signal applied from one of the signal detecting magnetic resistance elements and the compensating electric signal applied from the compensating magnetic resistance element.

8. A position detector device comprising:
a moving object;
a magnetically-recorded section on a moving surface of the moving object, said magnetically-recorded section including a single track provided with a regularly magnetized area and another magnetized area, said another magnetized area having a recorded wavelength which is substantially equal to a recorded wavelength of the regularly magnetized area, and said another magnetized area being different in magnetized intensity from said regularly magnetized area;
means for converting changes in magnetic field caused by the movement of the moving object into an electrical signal; and
means for detecting a continuous signal caused by said electrical signal at the regularly magnetized area
and a reference signal caused by said electrical signal at said another magnetized area, different in magnetized intensity from the regularly magnetized area, so as to detect information relating to the position of said moving object.

9. The position detector device according to claim 8, wherein said converting means includes a constant-current power source and a signal detecting magnetic resistance element connected to said constant-current power source to output said electrical signal responsive to changes in magnetic field.

10. The position detector device according to claim 9, wherein said converting means includes a compensating magnetic resistance element for adding a compensating signal to said electrical signal so as to compensate for drift of said electrical signal caused by temperature change.

11. The position detector device according to claim 9, wherein said another magnetized area is formed by alternating-current-erasing a part of said regularly magnetized area.

12. The position detector device according to claim 11, wherein said converting means includes means for adding a DC bias magnetic field to the signal detecting magnetic resistance element.

13. A position detector device comprising:
a moving object;
a magnetically-recorded section mounted on a surface of the moving object, said magnetically-recorded section including a single track provided with a plurality of magnetized areas which are substantially equal in width and multipolarly-magnetized, said single track having a first portion including a plurality of magnetized areas which are substantially equal in magnetized intensity, and a second portion including at least one magnetized area which is different in magnetized intensity from the first portion;
means for converting changes in a magnetic field caused by the movement of the moving object into electrical signals; and
means for detecting, from the electrical signals, a continuous signal generated by at least said first portion and a reference signal generated by only said second portion, thereby obtaining information on a position of the moving object.

14. The position detector device according to claim 13, wherein said converting means includes a constant-current power source and a signal detecting magnetic resistance element connected to said constant-current power source to output said electrical signal responsive to a change in magnetic field.

15. The position detector device according to claim 14, wherein said converting means includes a compensating magnetic resistance element for adding a compensating signal to said electrical signal so as to compensate for drift of said electrical signal caused by temperature change.

16. The position detector device according to claim 14, wherein said second portion is formed by alternating-current-erasing a part of said regularly magnetized area.

17. The position detector device according to claim 16, wherein said converting means includes means for adding a DC bias magnetic field to the signal detecting magnetic resistance element.

* * * * *

UNITED STATES PATENT AND TRADEMARK OFFICE
CERTIFICATE OF CORRECTION

PATENT NO. : 5,168,274
DATED : December 1, 1992
INVENTOR(S) : WAKAMATSU, Seiichi It is certified that error appears in the above-identified patent and that said Letters Patent is hereby corrected as shown below:

Title Page, in Section [56] References Cited, insert the following:

FOREIGN PATENT DOCUMENTS 59-24970    7/1984    Japan
60-196619   10/1985   Japan Column 9, line 56, change "80/2" to --$\lambda/2$--.

Signed and Sealed this

First Day of February, 1994

Attest:

BRUCE LEHMAN

*Attesting Officer*    Commissioner of Patents and Trademarks